(12) United States Patent
Ravi et al.

(10) Patent No.: US 12,660,269 B2
(45) Date of Patent: Jun. 16, 2026

(54) HETERO EPITAXIAL STRUCTURE AND METHOD THEREFOR

(71) Applicant: ThinSiC Inc., Santa Clara, CA (US)

(72) Inventors: Tirunelveli Subramaniam Ravi, San Jose, CA (US); Jinho Seo, Saratoga, CA (US); Bishnu Prasanna Gogoi, Scottsdale, AZ (US)

(73) Assignee: ThinSiC Inc., Santa Clara, CA (US)

( * ) Notice: Subject to any disclaimer, the term of this patent is extended or adjusted under 35 U.S.C. 154(b) by 418 days.

(21) Appl. No.: 18/542,650

(22) Filed: Dec. 16, 2023

(65) Prior Publication Data

US 2025/0203984 A1      Jun. 19, 2025

(51) Int. Cl.
H10D 62/82        (2025.01)
H10P 14/20        (2026.01)

(52) U.S. Cl.
CPC ........... H10D 62/82 (2025.01); H10P 14/276 (2026.01)

(58) Field of Classification Search
CPC .. H10D 62/82; H10D 62/8503; H10P 14/276; H10P 14/271; H10P 14/272; H10P 14/2904; H10P 14/3216; H10P 14/3416; H10H 20/019
See application file for complete search history.

(56) References Cited

U.S. PATENT DOCUMENTS

| | | | |
|---|---|---|---|
| 6,617,060 B2 | 9/2003 | Weeks, Jr. et al. | |
| 6,649,287 B2 | 11/2003 | Weeks, Jr. et al. | |
| 8,409,895 B2 | 4/2013 | Zhu et al. | |
| 8,629,477 B2 | 1/2014 | Lochtefeld et al. | |
| 8,709,921 B2 | 4/2014 | Su | |
| 8,716,049 B2 | 5/2014 | Su et al. | |
| 9,196,795 B2 | 11/2015 | Su et al. | |
| 9,431,477 B2 | 8/2016 | Kryliouk et al. | |
| 9,450,143 B2 | 9/2016 | Sharma et al. | |
| 10,439,099 B2 | 10/2019 | Liao et al. | |
| 11,721,547 B2 | 8/2023 | Hecht et al. | |
| 11,735,642 B2 * | 8/2023 | Schulze | H10D 12/031 257/77 |

(Continued)

OTHER PUBLICATIONS

Masataka Imura et al., Epitaxial lateral overgrowth of AlN on trench-patterned AlN layers, Journal of Crystal Growth 298 (2007), pp. 257-260, Elsevier B.V. (The Netherlands).

(Continued)

*Primary Examiner* — Jonathan Han

(57)        ABSTRACT

A heterogeneous epitaxial structure formed on a SiC (silicon carbide) substrate. An intermediate layer comprising AlN is formed overlying the SiC substrate. The surface of the intermediate layer comprises AlN formed by lateral epitaxial growth. The lateral epitaxial growth merges to form the surface comprising a MELO layer (merged epitaxial lateral overgrowth). The intermediate layer includes a carbon layer underlying the MELO layer. At least one device layer comprising GaN (gallium nitride) is formed overlying the surface of the intermediate layer in which one or more semiconductor devices are formed. The carbon layer is heated to fracture portions of the intermediate layer to separate the SiC substrate from the intermediate layer. The SiC substrate is not consumed by the separation thereby allowing perpetual reuse in semiconductor wafer processing.

24 Claims, 17 Drawing Sheets

(56)     References Cited

U.S. PATENT DOCUMENTS

| 2005/0142876 | A1 | | 6/2005 | Katona et al. |
| 2012/0028425 | A1 | * | 2/2012 | Lu ..................... H10D 30/0297 |
| | | | | 257/E21.409 |
| 2021/0254241 | A1 | | 8/2021 | Kamikawa |
| 2021/0381124 | A1 | | 12/2021 | Kamikawa et al. |
| 2022/0108883 | A1 | | 4/2022 | Kamikawa et al. |
| 2022/0189761 | A1 | | 6/2022 | Ravi et al. |

OTHER PUBLICATIONS

Mola Kueller et al. Modulated Epitaxial Lateral Overgrowth of AIN for Efficient UV LEDs, IEEE Photonics Technology Letters, vol. 24, No. 18, Sep. 15, 2012, pp. 1603-1605, IEEE (USA).

\* cited by examiner

HETERO EPITAXIAL STRUCTURE AND METHOD THEREFOR

FIELD

This invention relates to semiconductor device on silicon carbide manufacture, and in particular to the formation of a hetero epitaxial structure.

BACKGROUND

The use of wide bandgap (WBG) semiconductors has increased dramatically in recent years in power electronics. Their ability to operate efficiently at higher voltages, powers, temperatures, and switching frequencies has enabled reduced cooling requirements, lower part counts, and the use of smaller passive components. WBG-based power electronics can further reduce the footprint and potentially the system cost of various renewable energy electrical equipment such as motor drivers and inverters.

Among the WBG semiconductors for power electronics, Silicon Carbide (SiC) has now been increasingly used for high voltage drivers (>1200V) whereas Gallium Nitride (GaN) has been experiencing increased use in both higher power and higher frequency applications. From the substrate standpoint, 4H-Silicon carbide (SiC) Single Crystal Substrates have been used for both SiC and GaN devices since SiC and GaN epitaxial layers can be grown with reduced defects on SiC substrates. The SiC substrate is a significant portion of the cost to manufacture semiconductor devices. While the SiC substrate quality has dramatically improved in the recent years, the cost has not come down since substrate fabrication is a complex process starting with vapor phase ingot growth followed by ingot cropping, then wire sawing of individual wafers, and finally grinding and polishing of the substrate, and as of now, there has been no proven practical method to eliminate any of these foregoing steps.

The manufacture of WBG semiconductors is expanding as WBG devices are being used in many applications that have a mass market. Market and device applications are becoming more diverse as the cost of WBG devices is reduced. For example, semiconductor substrates for WBG semiconductors are being produced that use high currents that require large die sizes. Defects will play a role in the larger die sizes as they can reduce die yields. Therefore, to maximize die yield, any cost reduction activity regarding the substrate is paramount while also maintaining low defect densities in the active epitaxial layer. In particular, GaN substrates are small in size compared to other substrates and the cost to manufacture a high quality GaN substrate of the same size as SiC substrate is not competitive at this time.

Accordingly, it is desirable to produce a process in which GaN devices can be manufactured at low cost with improved performance and reliability.

BRIEF DESCRIPTION OF THE DRAWINGS

Various features of the system are set forth with particularity in the appended claims. The embodiments herein, can be understood by reference to the following description, taken in conjunction with the accompanying drawings, in which:

FIG. 17 is an illustration of the substrate after reclaim in accordance with an example embodiment;

DETAILED DESCRIPTION

Figure 1:
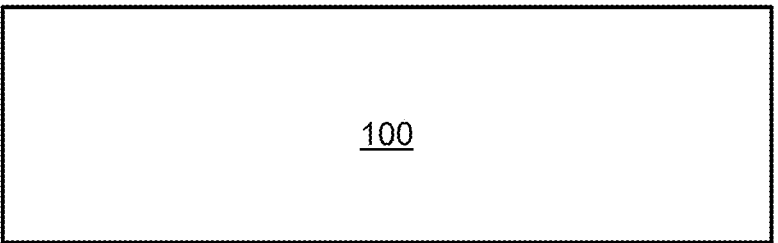
FIG. 1 is an illustration of a substrate of a first material in accordance with an example embodiment.

The following description of embodiment(s) is merely illustrative in nature and is in no way intended to limit the invention, its application, or uses.

For simplicity and clarity of the illustration(s), elements in the figures are not necessarily to scale, are only schematic, are non-limiting, and the same reference numbers in different figures denote the same elements, unless stated otherwise. Additionally, descriptions and details of well-known steps and elements are omitted for simplicity of the description. Notice that once an item is defined in one figure, it may not be discussed or further defined in the following figures.

The terms "first", "second", "third" and the like in the Claims or/and in the Detailed Description are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated.

Processes, techniques, apparatus, and materials as known by one of ordinary skill in the art may not be discussed in detail but are intended to be part of the enabling description where appropriate.

While the specification concludes with claims defining the features of the invention that are regarded as novel, it is believed that the invention will be better understood from a consideration of the following description in conjunction with the drawing figures, in which like reference numerals are carried forward.

The current invention describes a heterogenous epitaxial structure used for the fabrication of a plurality of semiconductor devices. A heterogenous epitaxial structure is used for the fabrication of semiconductor devices with high reliability, good yield and superior electrical and thermal performance. The invention is described with an example embodiment of a heterogenous epitaxial structure used for the implementation of a LED (Light Emitting Diode) comprising Gallium Nitride (GaN) although other structures known to one skilled in the art can be formed in the low defectivity epitaxy described herein.

FIG. 1 is an illustration of a substrate 100 of a first material in accordance with an example embodiment. In one embodiment, substrate 100 is a semiconductor substrate. In the example embodiment, substrate 100 is a silicon carbide (SiC) wafer that is typically off-cut by 4 degrees. Substrate 100 is used for the fabrication of semiconductor devices such as Light Emitting Diodes (LED), SBD (Schottky Barrier Diode), MOSFETS (Metal Oxide Semiconductor Field Effect Transistor), IGBT (Insulated Gate Bipolar Transistor) among other devices. In the example embodiment, substrate 100 comprises a silicon carbide wafer and the semiconductor device is a LED (Light Emitting Diode). A plurality of semiconductor devices can be built on substrate 100 using techniques of semiconductor fabrication. While substrate 100 used in the example embodiment is silicon carbide, the invention can be implemented in other substrates such as gallium nitride, gallium arsenide, indium phosphide, silicon, silicon on insulator (SOI), sapphire, SOS (silicon on sapphire) germanium among others. In addition, the invention may be used in other semiconductor devices such as photonic devices, lasers, RF devices, among others.

In one embodiment, substrate 100 is a crystalline 4H silicon carbide wafer with a preferred crystalline orientation of <0001> with an offcut towards <1120> of 4 degrees. In one embodiment, substrate 100 comprising SiC is in the range of 300-400 microns in thickness. In one embodiment, substrate 100 may be a single side polished or double side polished wafer and can be considered as the parent wafer, for considerations that are described in subsequent process steps in the implementation of the current invention. In one embodiment, substrate 100 is the basic platform on which the example embodiment is implemented to support the process flow in accordance with the current invention. In one embodiment, substrate 100 is a reusable semiconductor substrate that is used for fabrication of semiconductor devices multiple times in accordance with the current invention. In one embodiment, the process disclosed herein below enables the perpetual reuse of substrate 100 thereby providing substantial cost savings in the fabrication of semiconductor devices since substrate 100 is a substantial portion of the overall cost in the fabrication process.

Figure 2:
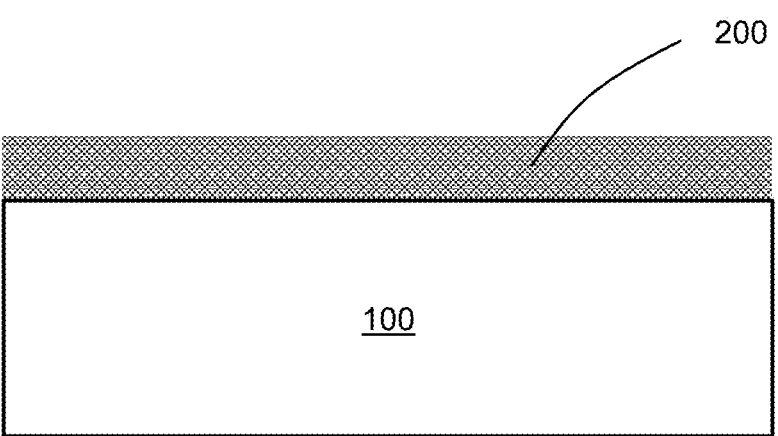
FIG. 2 is an illustration of a layer of a second material overlying the substrate in accordance with an example embodiment.

FIG. 2 is an illustration of a layer 200 of a second material overlying substrate 100 in accordance with an example embodiment. Layer 200 of a second material is grown overlying surface of substrate 100 and has a different lattice constant than material of substrate 100 but is sufficiently close in the lattice constant (less than 5%) to form a single crystal layer. Layer 200 is grown overlying surface of substrate 100 using an epitaxial growth process. In the example embodiment, layer 200 comprises single crystal Aluminum Nitride (AlN) overlying substrate 100 comprising silicon carbide. In the example embodiment, layer 200 comprising AlN is grown using MOVPE (Metal Organic Vapor Phase Epitaxy), HT-MOVPE (High Temperature Metal Organic Vapor Phase Epitaxy) among other methods. In the example embodiment, layer 200 comprising AlN is grown using HT-MOVPE with TMAl (TriMethylAluminum) and ammonia ($NH_3$) as the precursor gases in the reactor. In the example embodiment, the gas flow rates, gas ratio between $TMAl/NH_3$, temperature, pressure and other parameters are controlled to form an epitaxial layer of layer 200 comprising AlN overlying substrate 100 comprising silicon carbide. In the example embodiment, thickness of layer 200 comprising AlN is between (200-3000) nm. In the growth of layer 200 overlying surface of substrate 100, there are dislocation defects formed due to the lattice constant mismatch as well as the surface and crystalline defects in the underlying substrate. In the example embodiment, layer 200 comprising AlN, there is density of defects such as threading dislocations, screw dislocations among others which can cause device performance and reliability issues. Accordingly, it is necessary to develop techniques to reduce the density of defects in layer 200 below an acceptable defect density ($10^{\char`\^}9/cm^2$) for reliable device performance.

Figure 3:
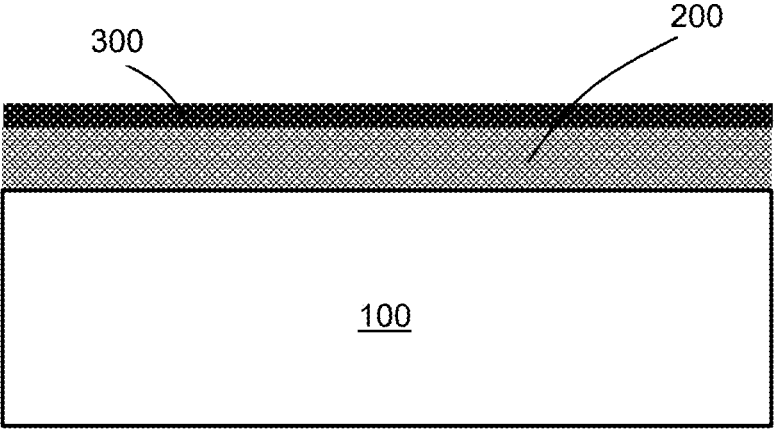
FIG. 3 is an illustration of a hard mask layer overlying the layer of the second material overlying the substrate in accordance with an example embodiment.

FIG. 3 is an illustration of a hard mask layer 300 overlying layer 200 of a second material overlying substrate 100 in accordance with an example embodiment. Hard mask layer 300 is deposited over the surface of layer 200. Hard mask layer 300 is deposited using techniques such as CVD (Chemical Vapor Deposition), LPCVD (low pressure chemical vapor deposition), PECVD (Plasma Enhanced Chemical Vapor Deposition), APCVD (Atmospheric Pressure Chemical Vapor Deposition), SACVD (Sub Atmospheric Chemical Vapor Deposition) among other techniques. PVD (Physical Vapor Deposition), or ALD (Atomic layer Deposition) may also be used for forming hard mask layer 200. In the example implementation, hard mask layer 200 comprises PECVD (Plasma Enhanced Chemical Vapor Deposition) silicon oxide. The thickness of silicon oxide hard mask layer 200 is selected based on the requirements of subsequent processing steps as described in the example implementation and is in the range of 100-3000 nm. The thickness of hard mask layer 200 is determined by the specific requirements of the implementation and is well known to those skilled in the art.

Figure 4:
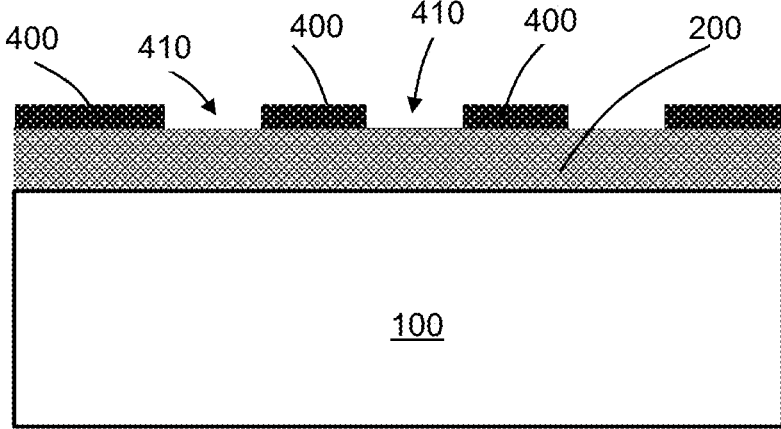
FIG. 4 is an illustration of a plurality of openings formed in the hard mask layer in accordance with an example embodiment.

FIG. 4 is an illustration of a plurality of openings 410 formed in hard mask layer 300 of FIG. 3 in accordance with an example embodiment. In one embodiment, hard mask layer 300 of FIG. 3 is deposited overlying the surface of layer 200 overlying substrate 100 and is patterned to subsequently support the formation of plurality of openings 410 that expose areas of a surface of layer 200. A remaining patterned hard mask 400 is formed after the patterning process. Plurality of openings 410 are formed in hard mask layer 300 of FIG. 3 by using methods of lithography and etching techniques commonly used in the semiconductor industry. In one embodiment, remaining patterned hard mask 400 is left in areas to protect layer 200 from being etched. The shape of plurality of openings 410 are determined by the requirements of epitaxial growth in subsequent steps in the implementation of the example embodiment. In one embodiment, plurality of openings 410 may be in the shape of squares or rectangles. In another embodiment, plurality of openings 410 may be in the shape of triangles, hexagons or diamonds. The size of plurality of openings 410 may be in the range of (20-500) nm and determined by the requirements of epitaxial overgrowth in the subsequent steps of fabrication of the example device. In one embodiment, spacing between adjacent openings of plurality of openings 410 is determined by the requirements of epitaxial overgrowth in the subsequent steps of fabrication of the example device and can be in the range of 500 nanometers to 5 micrometers. Plurality of openings 410 are generated on a surface of hard mask layer 300 of FIG. 3 by using lithography techniques that are well known to those skilled in the art. In one embodiment, plurality of openings 410 are implemented using optical lithography using UV (Ultra Violet), DUV (Deep Ultra Violet) or EUV (Extreme Ultra Violet) light sources. In another embodiment, plurality of openings 410 are implemented using an electron beam direct write technique or laser beam direct write technique. In yet another embodiment, plurality of openings 410 are implemented using Nano-Imprint Lithography (NIL).

In one example embodiment, plurality of openings 410 are formed by first coating a surface of hard mask layer 300 of FIG. 3 with a photosensitive layer of photoresist, which may be positive or negative in its chemistry. In the example embodiment, positive photoresist is used in coating the surface of hard mask layer 300 from FIG. 3. An optical tool called a stepper is used to transfer the pattern of openings on to the positive photoresist layer using chemistries that are well known to those skilled in the art. The choice of the photoresist layer, thickness of the photoresist layer, the exposure and develop times for the subsequent chemical steps are well known to those skilled in the art and determined by the requirements of accurate pattern transfer from the photoresist layer to hard mask layer 300 to subsequently form plurality of openings 410 and leaving patterned hard mask 400. The stepper transfers the pattern of plurality of openings 410 to cover the surface of hard mask layer 300 overlying layer 200 comprising AlN (Aluminum Nitride) overlying substrate 100 comprising silicon carbide.

After the pattern transfer is completed using lithography, the next step is the patterning of hard mask layer 300 of FIG. 3 using etching techniques to selectively remove the hard mask layer 300 of FIG. 3 overlying layer 200 thereby leaving patterned hard mask 400 overlying layer 200. The selective removal of hard mask layer 300 to form patterned hard mask 400 may use Reactive Ion Etching (RIE). Different gases may be used to form a plasma to selectively remove the portions of hard mask layer 300 exposed by the patterned photoresist. The choice of gases for the RIE is determined by hard mask layer 300 of FIG. 3 used in the implementation. In the example embodiment, with silicon oxide used as hard mask layer 300, fluorine-based chemistries such as $SF_6$, $CF_4$, $CHF_3$, and other gases may be used in the RIE. Accordingly, in the example embodiment with silicon oxide as hard mask layer 300, plurality of openings

410 are etched in hard mask layer 300 of FIG. 3 using a fluorine-based chemistry that exposes the surface of layer 200 comprising AlN. Patterned hard mask 400 remains in areas overlying the surface of layer 200 comprising AlN to protect or mask the surface of layer 200 from etching. After patterning hard mask layer 300 of FIG. 3, the photoresist is stripped using techniques well known to those skilled in the art and may be dry, wet or a combination of dry and wet processing.

Figure 5:
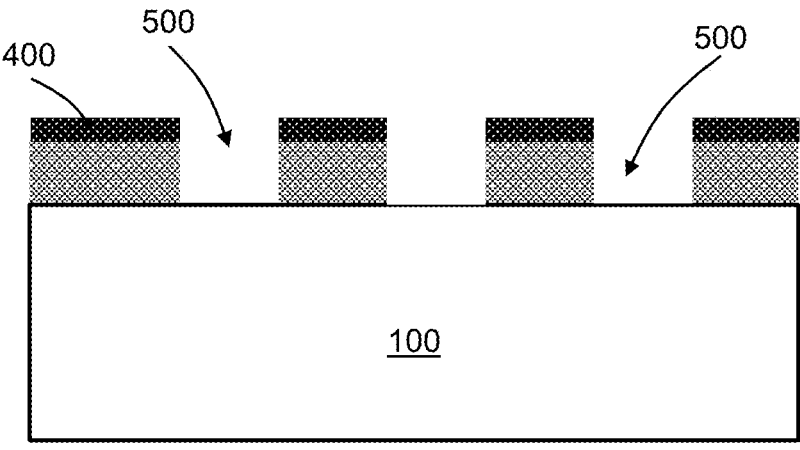
FIG. 5 is an illustration of openings formed in the layer of the second material in accordance with an example embodiment.

FIG. 5 is an illustration of openings 500 formed in layer 200 in accordance with an example embodiment. Openings 500 are formed after hard mask layer 300 of FIG. 3 is etched to form plurality of openings 410 in FIG. 4. In one embodiment, the surface of layer 200 exposed by plurality of openings 410 of FIG. 4 is then etched to form openings 500 using RIE (Reactive Ion Etching). In one embodiment, layer 200 comprising AlN (Aluminum Nitride) is etched using patterned hard mask 400 of FIG. 4 to form openings 500 with an aspect ratio that is determined by the requirements of epitaxial growth in subsequent processing of the example device. In one embodiment, layer 200 comprising AlN is etched using a chlorine chemistry with $Cl_2$, $BCl_3$, Argon among other gases to form openings 500 in layer 200. The process parameters such as gas flows, gas ratios, pressure, power, bias voltage among other process parameters are changed to determine the depth and profile of opening 500 in layer 200. It should be noted that other substrates can be used similarly as disclosed herein above. In one embodiment, an inductively coupled plasma (ICP) with high density may also be used to form openings 500 in layer 200 comprising AlN.

Figure 6:
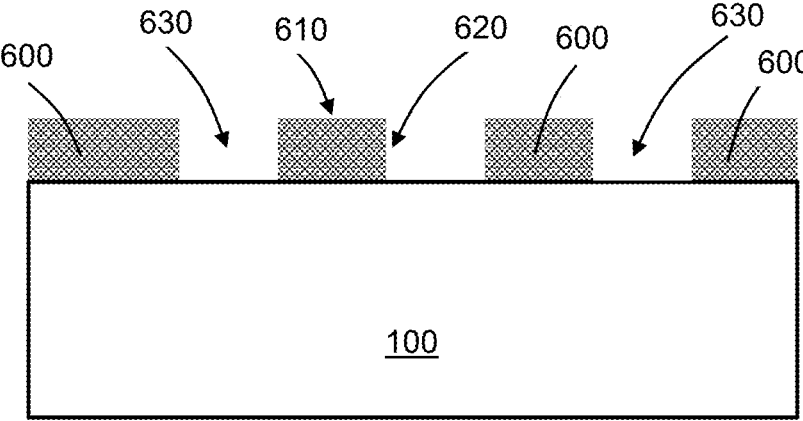
FIG. 6 is an illustration of a plurality of pillars formed in the layer in accordance with an example embodiment.

FIG. 6 is an illustration of a plurality of pillars 600 formed in layer 200 in accordance with an example embodiment. Plurality of pillars 600 are shown after the removal of patterned hard mask 400 of FIG. 5. In an example embodiment, patterned hard mask 400 of FIG. 5 is removed by using wet or dry chemical etching and is determined by the choice of hard mask layer material. In the example embodiment, patterned hard mask 400 of FIG. 5 comprises a PECVD silicon oxide that is removed using a wet chemistry of BHF (Buffered Hydrofluoric Acid). Other solutions for etching PECVD silicon oxide may include HF (Hydrofluoric Acid) in various dilutions in water. In the example embodiment, layer 200 comprising AlN overlying substrate 100 comprising SiC are cleaned in preparation for the next step in the fabrication of the example device. In one embodiment, the pattern of plurality of pillars 600 are shaped as to be circular, triangular, rectangular, hexagonal, truncated pyramidal, conical, or a point, to expose crystal planes that facilitate high quality epitaxial overgrowth with low defect density in subsequent processing steps in accordance with the current invention. Plurality of pillars 600 comprise top surface area 610 with a height 620 and spacing 630 between adjacent pillars. In one embodiment, plurality of pillars 600 has top surface area 610 in the range of (0.25-4) micrometers. In one embodiment, plurality of pillars 600 has height 620 in the range of (0.4-4) micrometers. In one embodiment, plurality of pillars 600 has spacing 630 between adjacent pillars in the range of (0.4-4) micrometers. The shape, size, height 620 and top surface area 610 of plurality of pillars 600 and spacing 630 between adjacent pillars of plurality of pillars 600 are determined by the requirements of AlN (Aluminum Nitride) epitaxy as subsequently described herein.

Figure 7A:
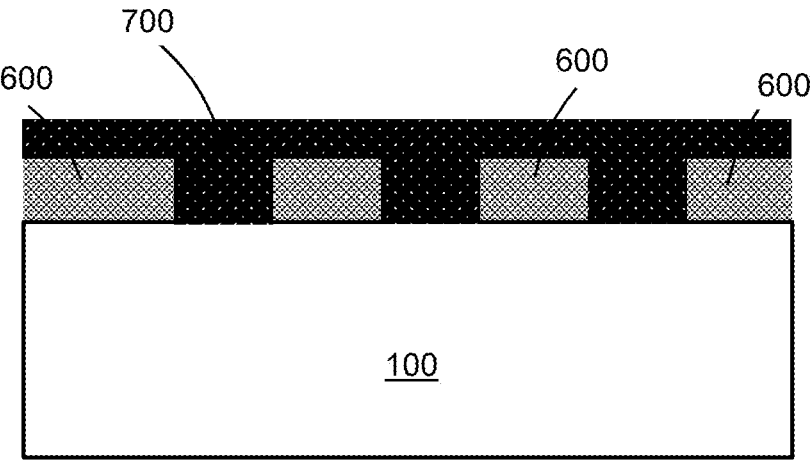
FIG. 7A in an illustration of a refill layer formed over the plurality of pillars and in the plurality of openings after removal of the patterned hard mask in accordance with an example embodiment.

FIG. 7A in an illustration of a refill layer 700 formed over plurality of pillars 600 and in plurality of openings 500 of FIG. 5 after removal of patterned hard mask 400 of FIG. 4 in accordance with an example embodiment.

In one embodiment, refill layer 700 is formed overlying plurality of pillars 600 and in plurality of openings 500 of FIG. 5 after removal of patterned hard mask 400 of FIG. 4. In one embodiment, refill layer 700 is a carbon layer. In another embodiment, refill layer 700 is a polymer layer that is deposited and then subsequently converted into a carbon layer. In another embodiment, refill layer 700 is a tantalum carbide layer. In general, refill layer 700 is a layer that can be subsequently targeted specifically after further wafer processing is performed. For example, refill layer 700 can be selectively heated by laser in a subsequent step which will be described in further detail herein below. In one embodiment, the laser will penetrate and go through substrate 100 or other layers overlying or underlying substrate 100 (with no effect to substrate 100 or the the other layers) and be absorbed by layer 700.

Refill layer 700 can be formed over plurality of pillars 600 and in plurality of openings 500 of FIG. 5 after removal of patterned hard mask 400 of FIG. 4 using different methods and processes.

In one embodiment, refill layer 700 may be formed by spin coating a polymer layer and then subsequently converting it into a carbon layer by pyrolysis in an inert environment. In another embodiment, refill layer 1000 may be formed by CVD (Chemical Vapor Deposition) of a polymer layer such as Parylene and subsequently converting the deposited polymer layer into carbon by heating it at a high temperature (900-1400°) C in an inert environment such as nitrogen. In another embodiment, refill layer 700 may be formed by sputter deposition using a carbon target. Other methods of carbon deposition may include CVD (chemical vapor deposition) or ALD (Atomic layer Deposition) to form refill layer 700.

In an example embodiment, refill layer 700 is formed by spin coating a photoresist layer. The photoresist layer may be a positive polarity or negative photoresist. The choice of thickness of the photoresist layer is determined by the depth of plurality of pillars 600 and the final thickness of refill layer 700 required by the process. The final thickness of the spin-coated photoresist is determined by the choice of the viscosity of the photoresist and the spread and spin speed during the dispense of the photoresist. The spin-coated photoresist is then baked in a nitrogen environment at a temperature of (90-120)° C. to drive out solvents. In the pyrolysis process, plurality of pillars 600 coated with a photoresist layer is placed in a furnace and heated to (900-1400)° C. in an inert environment of nitrogen or in forming gas (nitrogen with hydrogen) to convert the spin-coated photoresist to carbon. During the pyrolysis process, the spin coated photoresist layer is converted into carbon while undergoing volumetric shrinkage. In the example embodiment, the pyrolysis process converts the spin-coated photoresist to carbon while also shrinking to form refill layer 700. In another embodiment, the spin-coated photoresist layer thickness may be modified by etching in an oxygen plasma after the spin-coating and prior to the pyrolysis process.

Figure 7B:
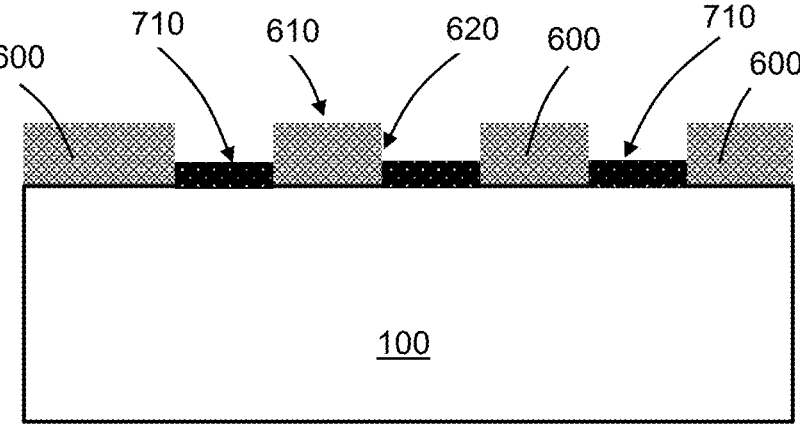
FIG. 7B is an illustration of a layer formed between the plurality of pillars in accordance with an example embodiment.

FIG. 7B is an illustration of a layer 710 formed between plurality of pillars 600 in accordance with an example embodiment. Layer 710 is used in the epitaxial growth processes of layer 200 overlying substrate 100 after formation of plurality of pillars 600 of FIG. 6 as will be subsequently described herein below. In one embodiment, layer 200 comprises AlN and substrate 100 comprises SiC. In general, layer 710 is formed by reducing the thickness of refill layer 700 from FIG. 7A using an etching process. In one embodiment, refill layer 700 of FIG. 7A is a carbon layer and is etched using RIE (Reactive Ion Etching) to form layer 710. In one embodiment, a height of refill layer 700 of FIG. 7A is reduced to a predetermined height to form layer 710. The predetermined height is achieved by RIE using oxygen, argon and other gases, as well known to those skilled in the art. In one embodiment, the predetermined height of layer 710 is in a range of (300-1000) nanometers (nm).

Figure 8:
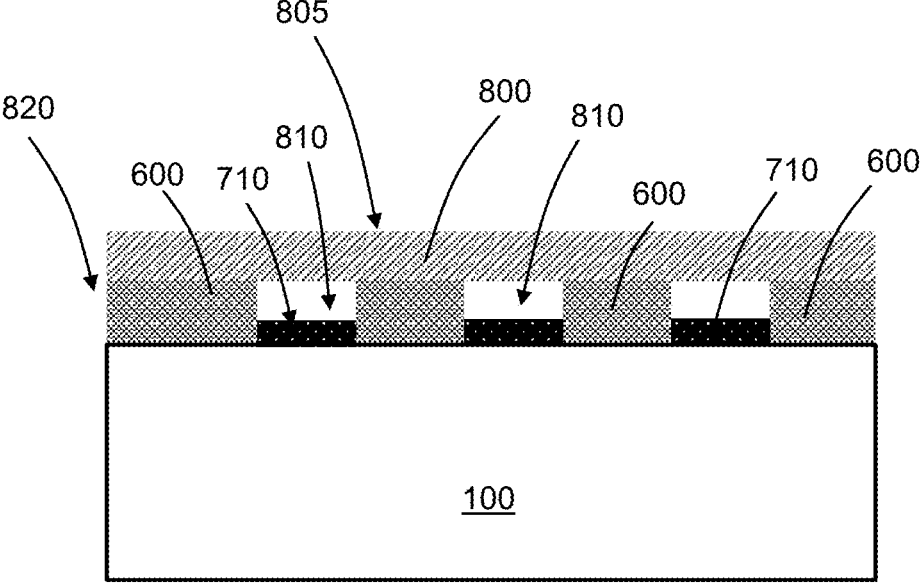
FIG. 8 is an illustration of a layer of merged epitaxial lateral overgrowth (MELO) layer in accordance with an example embodiment.

FIG. 8 is an illustration of a layer of merged epitaxial lateral overgrowth (MELO) layer 800 in accordance with an example embodiment. In an example embodiment, substrate 100 with plurality of pillars 600 formed in layer 200 with layer 710 of a third material is placed in an epitaxial reactor to form merged epitaxial lateral growth layer 800. In an example embodiment substrate 100 comprises silicon carbide and plurality of pillars 600 formed in layer 200 comprise AlN. Thus, plurality of pillars 600 are formed of a material that differs from substrate 100. The method of HT-MPVPE is used to grow the merged epitaxial lateral growth laterally by controlling the temperature, pressure, gas flow rates and ratios of TMAl (TriMethyl Aluminum) and ammonia such that lateral epitaxial growth of the AlN layer occurs. In the example embodiment, lateral epitaxial growth extends from the sidewalls of plurality of pillars 600 thereby coalescing to form merged epitaxial lateral overgrowth (MELO) layer 800. MELO layer 800 forms a contiguous layer overlying plurality of pillars 600 and the space between plurality of pillars 600. In one embodiment, at least one void is formed underlying MELO layer 800 as the lateral epitaxial growth extends from the sidewalls of plurality of pillars 600 to encase the area between pillars of the plurality of pillars 600. I the example embodiment, a plurality of voids 810 are encased underlying MELO layer 800 between plurality of pillars 600. In another embodiment, the lateral growth of AlN between plurality of pillars 600 results in the region between plurality of pillars 600 to be completely filled with lateral epitaxial overgrowth underlying merged epitaxial lateral growth layer 800. In another embodiment, the growth conditions in the epitaxial process may be modulated to form polycrystalline AlN over surface of layer 710 of the third material in addition to the lateral epitaxial overgrowth from sidewalls of plurality of pillars 600 resulting in merged epitaxial lateral growth layer 800 enclosing regions of polycrystalline AlN over surface of layer 710.

In an example embodiment, the lateral epitaxial overgrowth from surface of plurality of pillars forming MELO layer 800 results in the reduction of defects propagated to MELO layer 800. The method of epitaxial lateral overgrowth with coalescence to form MELO layer 800 from the surface of plurality of pillars 600 results in a significant reduction in the density of dislocations in MELO layer 800. By ensuring that the area between plurality of pillars 600 is significantly greater than the top surface area of plurality of pillars 600, the merged epitaxial lateral growth layer 800 results in a significant reduction in the defect propagation in layer of merged epitaxial lateral growth layer 800.

In an example embodiment, the lateral epitaxial overgrowth from surface of plurality of pillars 600 forming MELO layer 800 results in a surface that is roughened due to the epitaxial growth process. In one embodiment, MELO layer 800 is polished to smooth the surface to prepare MELO layer 800 to be suitable for subsequent epitaxial growth of other layers. A Kiss polish may be used with CMP to provide a smooth surface 805 of MELO layer 800.

In general, merged epitaxial lateral growth layer 800 of the second material overlying plurality of pillars 600 of the second material results in an intermediate layer 820 of comprising the second material. In the example embodiment, intermediate layer 820 comprises MELO layer 800 overlying lateral epitaxial overgrowth underlying MELO layer 800, plurality of voids 810, and layer 710 comprising the third material in the space between plurality of pillars 600. In an example embodiment, substrate 100 of a first material comprises Silicon carbide, intermediate layer 820 of a second material comprises AlN, and layer 710 of a third material between plurality of pillars 600 comprises carbon.

Figure 9:
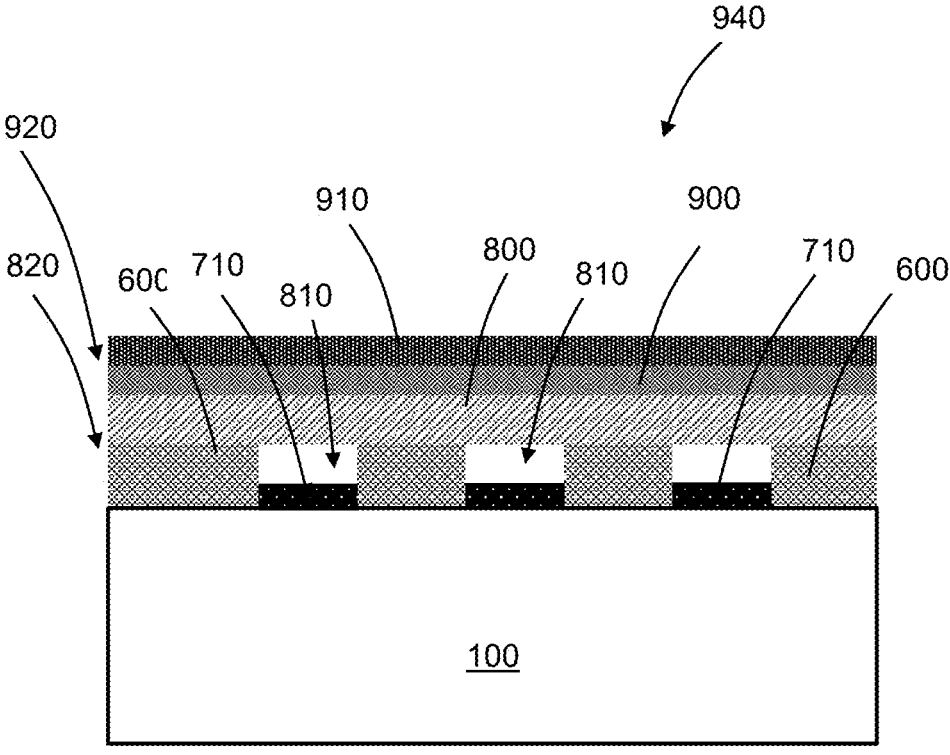
FIG. 9 is an illustration of a device layer of a fourth material overlying an intermediate layer in accordance with an example embodiment.

FIG. 9 is an illustration of a device layer 920 of a fourth material overlying intermediate layer 820 in accordance with an example embodiment. In an example embodiment, device layer 920 is grown overlying smooth surface 805 of FIG. 8 of intermediate layer 820 of a second material in an epitaxial reactor. In one embodiment, the surface of intermediate layer comprises MELO (merged epitaxial lateral overgrowth) layer 800 formed of epitaxial lateral overgrowth. Device layer 920 comprises one or more layers and may be grown in successive layers overlying surface 805 of MELO layer 800. Device layer 920 comprises a fourth material that is sufficiently lattice matched with the surface of underlying intermediate layer 820 comprising a second material such that the crystalline is single crystal. Device layer 920 may comprise multiple layers of a fourth single crystal material grown overlying surface of intermediate layer 820 comprising a second crystalline material. The number of layers, doping and thickness of each layer of the multiple layers of device layer 920 is determined by the devices that are formed in device layer 920. Device layer 920 may be used for the formation of semiconductor devices such as LEDs transistors, lasers, sensors among other semiconductor devices. Device layer 920 is grown overlying intermediate layer 820 in an epitaxial reactor using techniques such as HVPE (Hydride Vapor Phase Epitaxy), MOVPE (Metal Organic Vapor Phase Epitaxy) among other methods of epitaxial growth. In general, device layer 920 comprises a material different from intermediate layer 820 and substrate 100.

In an example embodiment, device layer 920 is used for the formation of a Light Emitting Diode (LED). In the example embodiment, device layer 920 comprises Gallium Nitride (GaN) overlying intermediate layer 820 comprising AlN (aluminum nitride). In one embodiment, device layer 920 comprises a layer 900 overlying surface 805 of FIG. 8 of intermediate layer 820 and a layer 910 overlying layer 900. In one embodiment, layer 900 comprises a n-doped GaN layer with multiple layers of InGaN/GaN multiple quantum wells (MQW) forming the active layers and layer 910 comprises a p-doped GaN layer. The doping, thickness, and number of layers in layer 900 is determined by the wavelength of the LED and other performance requirements of the LED. After the growth of the n-type and p-type GaN layers comprising layer 900 and 910, a thermal annealing step is performed to activate the dopants in the n-type and p-type doped GaN layers.

In FIG. 9, a heterogenous epitaxial structure 940 comprises substrate 100, intermediate layer 820 and device layer 920 in accordance with an example embodiment. In the example embodiment, heterogenous epitaxial structure 940 comprising substrate 100, intermediate layer 820, and device layer 920 is single crystal. In heterogenous epitaxial structure 940, substrate 100 comprises the first material, intermediate layer 820 comprises the second material and device layer 920 comprises the fourth material. The third material may be formed in intermediate layer 820 to assist in the process of exfoliation that is explained in detailed herein below. In heterogenous epitaxial structure 940, intermediate layer 820 may comprise one or more layers of the second material that is grown in an epitaxial reactor, and device layer 920 may comprise of one or more layers of a fourth material that is grown in an epitaxial reactor. Heterogenous epitaxial structure 940 may be used to fabricate a plurality of devices such as semiconductor devices.

Figure 10:
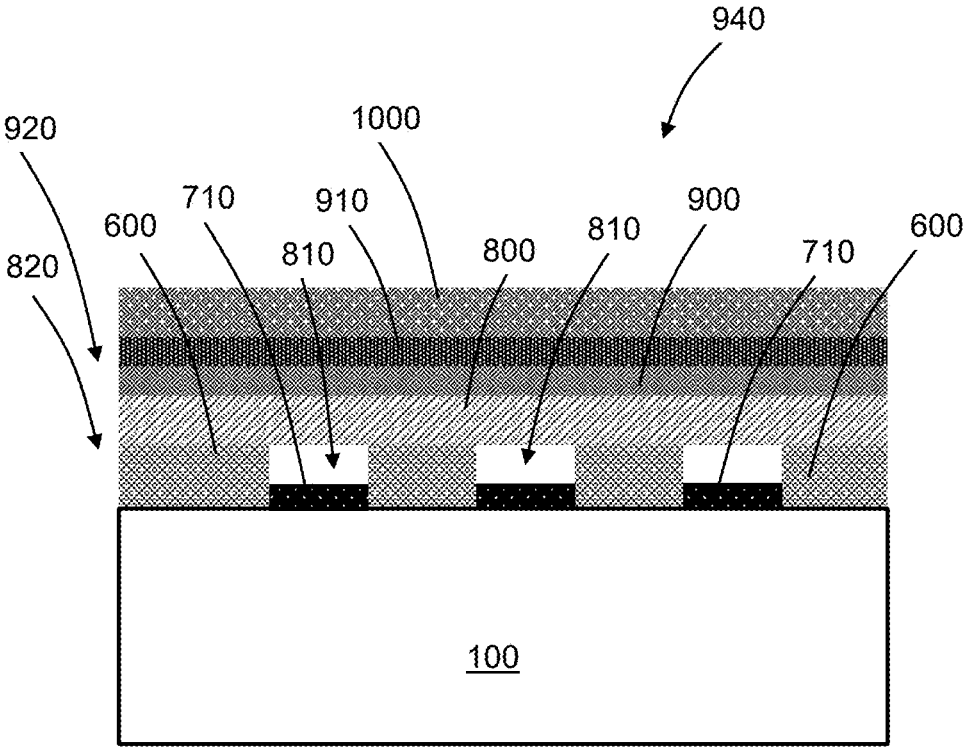
FIG. 10 is an illustration of a layer overlying a surface of the device layer in accordance with an example embodiment.

FIG. 10 is an illustration of a layer 1000 overlying a surface of device layer 920 in accordance with an example embodiment. In the example embodiment, layer 1000 is a transparent, conductive layer comprising ITO (Indium Tin Oxide) overlying the surface of layer 910 of device layer 920. Layer 1000 comprising ITO may be deposited by e-beam evaporation, RF sputtering among other methods of deposition. In the example embodiment, layer 1000 comprising ITO is used to make good ohmic contact to underlying layer 910 comprising p-type doped GaN (gallium nitride). The thickness of layer 1000 is determined by the requirements of low contact resistance to underlying layer 910. Layer 1000 comprising ITO may be annealed after deposition in a temperature in the range of 300 degrees Celsius to lower the contact resistance and increase the optical transmissivity.

Figure 11:
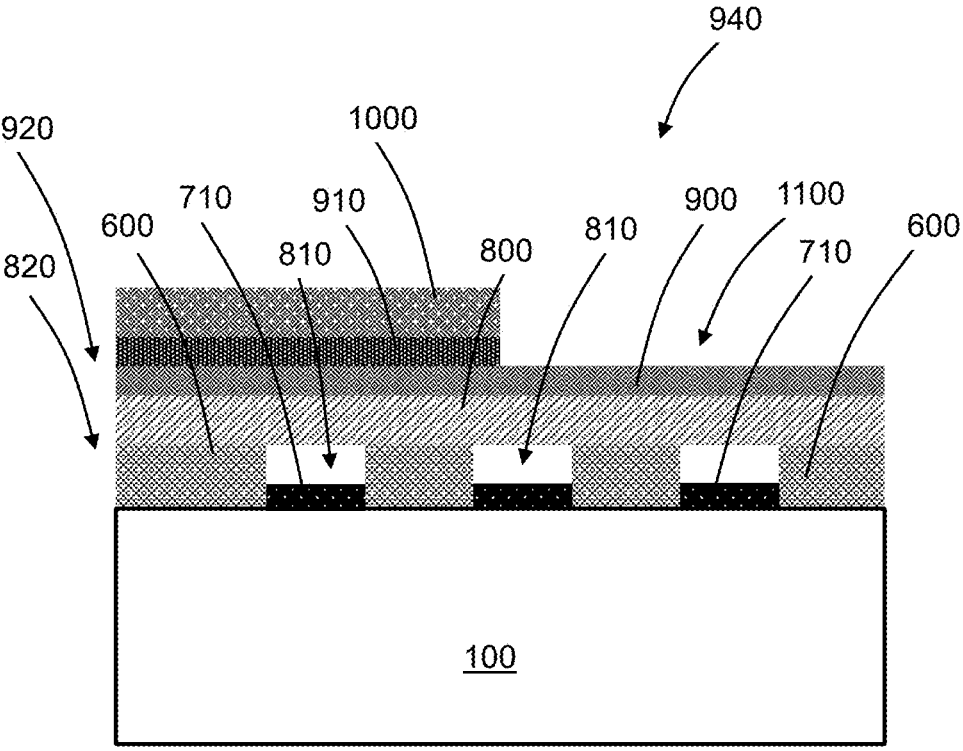
FIG. 11 is an illustration of contact opening to expose the device layer in accordance with an example embodiment.

FIG. 11 is an illustration of contact opening 1100 to expose layer 900 in accordance with an example embodiment. In the example embodiment, layer 1000 comprising ITO and layer 910 comprising p-doped GaN are etched to form contact opening 1100 to surface of underlying layer 900 comprising n-doped GaN with MQW LED devices. Contact opening 1100 is formed by using lithography and etching as well known to those skilled in the art. In the example embodiment, contact opening 1100 configured to expose layer 900 comprising n-doped GaN uses RIE (Reactive Ion Etching) with ICP (Inductively Coupled Plasma) to etch layer 1000 and layer 910 thereby exposing layer 900.

Figure 12:
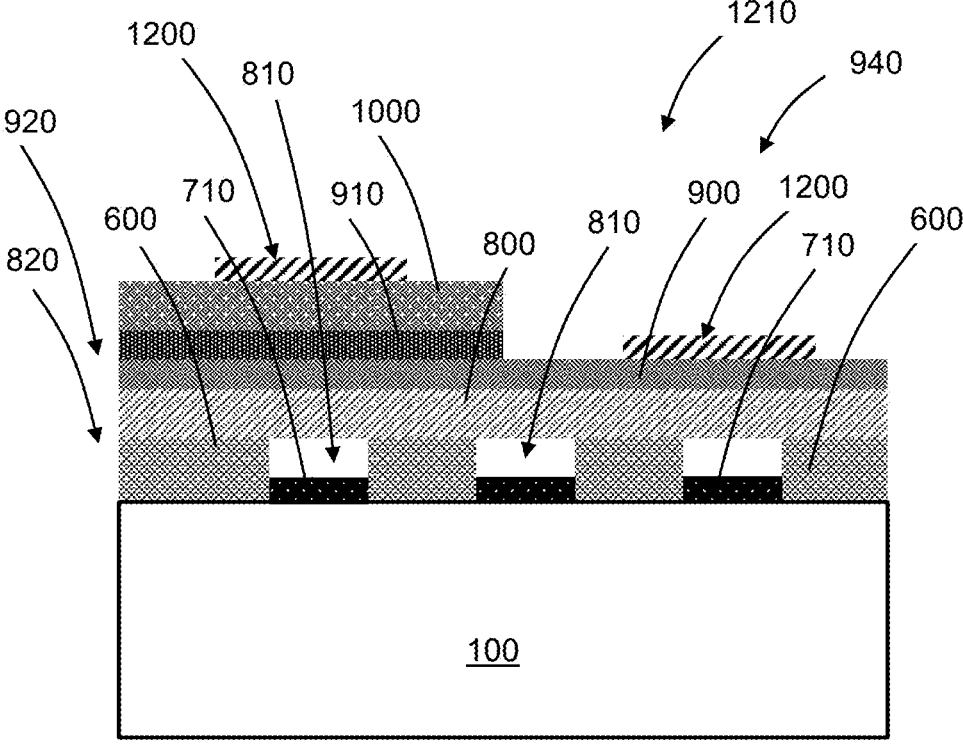
FIG. 12 is an illustration of contacts comprising metal in accordance with an example embodiment.

FIG. 12 is an illustration of contacts 1200 comprising metal in accordance with an example embodiment. In the example embodiment, contacts 1200 comprise patterned layers of metal to enable the LED to make external contact such as a package or PCB (Printed Circuit Board). In the example embodiment, contacts 1200 enable electrical connection to p-doped GaN layer through layer 1000 comprising ITO since it is electrically conductive and n-doped GaN layer through contact opening 1100 of FIG. 11. Contacts 1200 may be formed by using metal stacks such that good electrical contact can be achieved and may be deposited by e-beam evaporation, RF sputtering, electro-plating, among other deposition methods and may be patterned by lithography and etch, lift-off and other techniques. In an example embodiment, contacts 1200 comprise Cr/Au (Chrome/Gold). In another embodiment, contacts 1200 comprise Cr/Ni/Au (Chrome/Nickel/Gold). The size of contacts 1200 and composition of the metal stack of contacts 1200 are chosen to reduce the contact resistance to the corresponding conductive layers. In the example embodiment, heterogenous epitaxial structure 940 enables the formation of semiconductor device 1210 comprising a LED (Light Emitting Diode). Although a fabrication of a single semiconductor device is illustrated, it should be noted that more than one device is being formed simultaneously across semiconductor substrate 100. In one embodiment, semiconductor substrate 100 is a semiconductor wafer.

Figure 13:
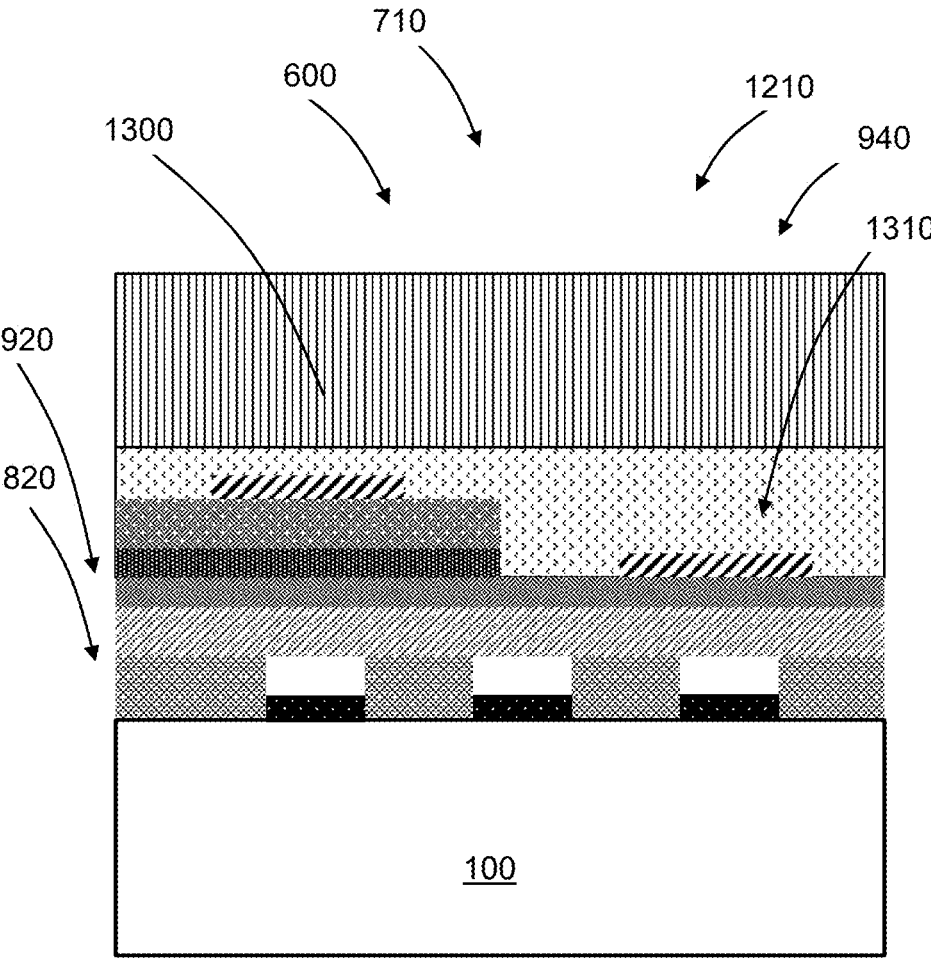
FIG. 13 is an illustration of a handle wafer temporarily coupled to a heterogenous epitaxial structure with a semiconductor device comprising a LED in accordance with an example embodiment.

FIG. 13 is an illustration of a handle wafer 1300 temporarily coupled to heterogenous epitaxial structure 940 with semiconductor device 1210 comprising a LED in accordance with an example embodiment. Handle wafer 1300 is temporarily coupled to heterogenous epitaxial structure 940 with semiconductor device 1210 comprising a LED with an adhesion layer 1310.

Heterogeneous epitaxial structure 940 with semiconductor device 1210 is temporarily coupled to handle wafer 1300 to enable an exfoliation process which is subsequently described. The exfoliation process enables the separation of a portion of heterogeneous epitaxial structure 940 with semiconductor device 1210 comprising a LED to be separated from substrate 100 comprising SiC (silicon carbide).

In one embodiment, heterogeneous epitaxial structure 940 with semiconductor device 1210 comprising a LED is attached to handle wafer 1300 by adhesion layer 1310 comprising adhesives such as UV sensitive glue among others. Handle wafer 1300 may be borosilicate glass which is UV transparent and may be used with a UV curable adhesive for the bonding.

The exfoliation process occurs at an exfoliation layer as shown in more detail, comprising plurality of pillars 600 of FIG. 7B and layer 710 of FIG. 7B. Layer 710 of FIG. 7B is formed between plurality of pillars 600 of FIG. 7B. In an example embodiment, plurality of pillars 600 of FIG. 7B are formed of a second material comprising AlN. In an example embodiment, layer 710 of FIG. 7B formed between plurality of pillars 600 comprises a third material of carbon.

In one embodiment, a plane of the exfoliation layer is substantially parallel to the surface of substrate 100 comprising silicon carbide. In one embodiment, the exfoliation occurs above the surface of substrate 100. In the example embodiment, the plane of exfoliation will occur at approximately layer 710 of FIG. 7B comprising carbon formed between plurality of pillars 600 comprising AlN (aluminum nitride). In one embodiment, the exfoliation process does not affect substrate 100.

Different methods of exfoliation may be used to separate portion of heterogeneous epitaxial structure 940 with semiconductor device 1210 comprising a plurality of LED (light emitting diodes) from substrate 100 comprising SiC (silicon carbide). In the example embodiment, a laser may be used for the exfoliation process. In the example embodiment, the laser wavelength is chosen to be substantially transparent to SiC. In the example embodiment, the laser is focused from the backside of substrate 100 comprising SiC to the exfoliation layer.

As previously mentioned, the exfoliation layer comprises plurality of pillars 600 of FIG. 7B and layer 710 of FIG. 7B between plurality of pillars 600. In the example embodiment, plurality of pillars 600 comprising the second material of AlN (aluminum nitride) and layer 710 formed between plurality of pillars 600 comprise the third material of carbon.

In the example embodiment, the energy from the laser is selectively coupled to layer 710 comprising carbon. The laser rapidly heats the carbon of layer 710 thereby producing a thermal shock that fractures pillars of AlN (aluminum nitride) adjacent to the heated carbon. The fracturing of plurality of pillars 600 due to thermal shock separates the heterogeneous epitaxial structure 940 with semiconductor device 1210 comprising a LED to be separated from substrate 100 comprising SiC. It should be noted that the thermal shock fractures the plurality of pillars, but the heat dissipates quickly and does not affect substrate 100.

In the example embodiment, a portion of heterogeneous epitaxial structure 940 with semiconductor device 1210 comprising a LED remains with handle wafer 1300 and substrate 100 comprising SiC is physically separated. Thus, the exfoliation process enables the separation of portion of heterogeneous epitaxial structure 940 with semiconductor device 1210 comprising a LED from substrate 100 comprising silicon carbide. As previously mentioned, there are a plurality of LEDS (light emitting diodes) formed on substrate 100. In the example embodiment, substrate 100 is a silicon carbide wafer. The silicon carbide wafer in its entirety is separated from the plurality of LEDS such that the silicon carbide wafer can be reused for forming other devices or LEDS.

Figure 14:
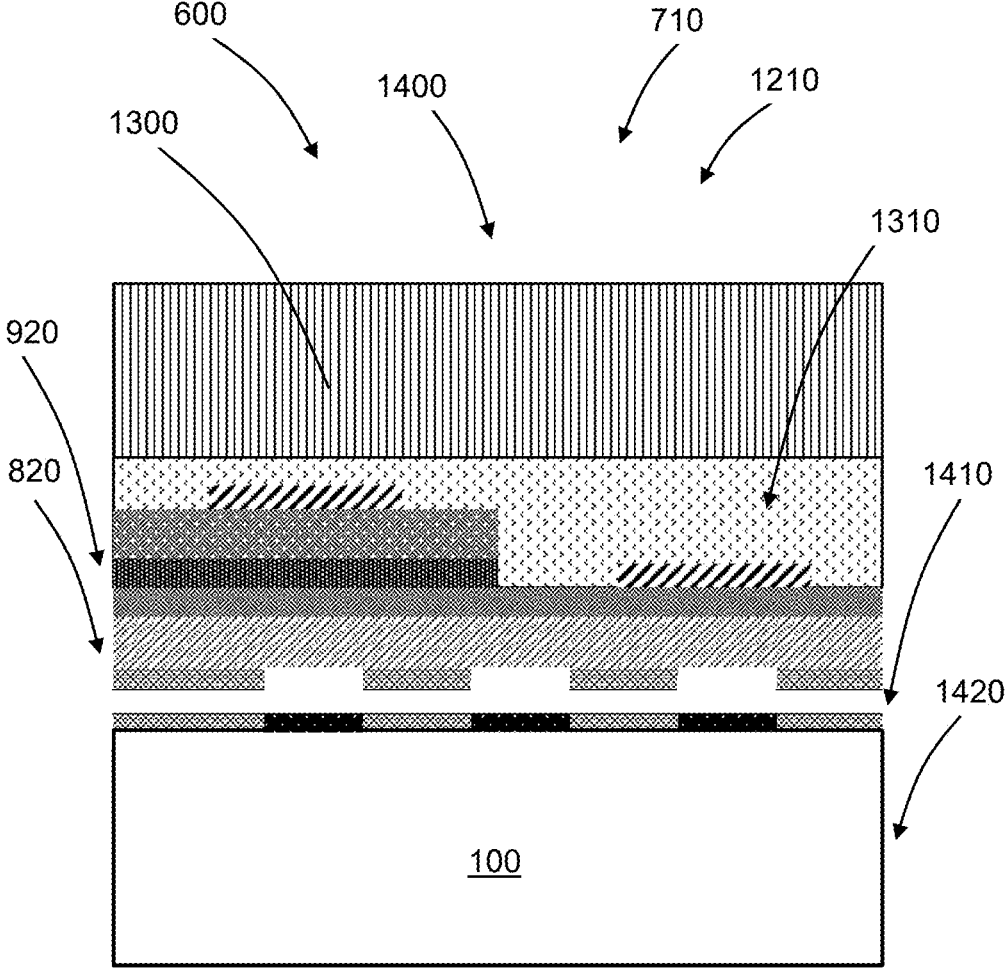
FIG. 14 is an illustration of an exfoliated device in accordance with an example embodiment.

FIG. 14 is an illustration of an exfoliated device 1400 in accordance with an example embodiment. In the example embodiment, using a laser causes the separation of a portion of heterogeneous epitaxial structure 940 with semiconductor device 1210 comprising a LED from substrate 100 comprising silicon carbide along a fracture plane 1410. In the example embodiment, exfoliated device 1400 comprises a portion of heterogeneous epitaxial structure 940 with semiconductor device 1210 temporarily coupled to handle wafer 1300 during the exfoliation process. In addition to exfoliated device 1400 attached to handle wafer 1300, the exfoliation process along fracture plane 1410 forms a substrate 1420 comprising substrate 100 coupled to remnants of plurality of pillars 600 and residue of layer 710. In the example, embodiment, substrate 1420 comprises substrate 100 of a first material of silicon carbide, remnants of plurality of pillars 600 comprising the second material of AlN (aluminum nitride) and residue of layer 710 comprising the third material of carbon. FIG. 14 is not drawn to scale since the thickness of exfoliated device 1400 may be in the range of 5-20 micrometers while substrate 1420 produced by the exfoliation process is substantially the same thickness as initial substrate 100 of FIG. 14 and is in the range of 300-500 micrometers. In the example embodiment, substrate 1420 is a wafer having a plurality of LEDS (light emitting diodes) formed thereon. The exfoliation process described herein above separates the entire wafer from the plurality of LEDS formed overlying the substrate.

Figure 15:
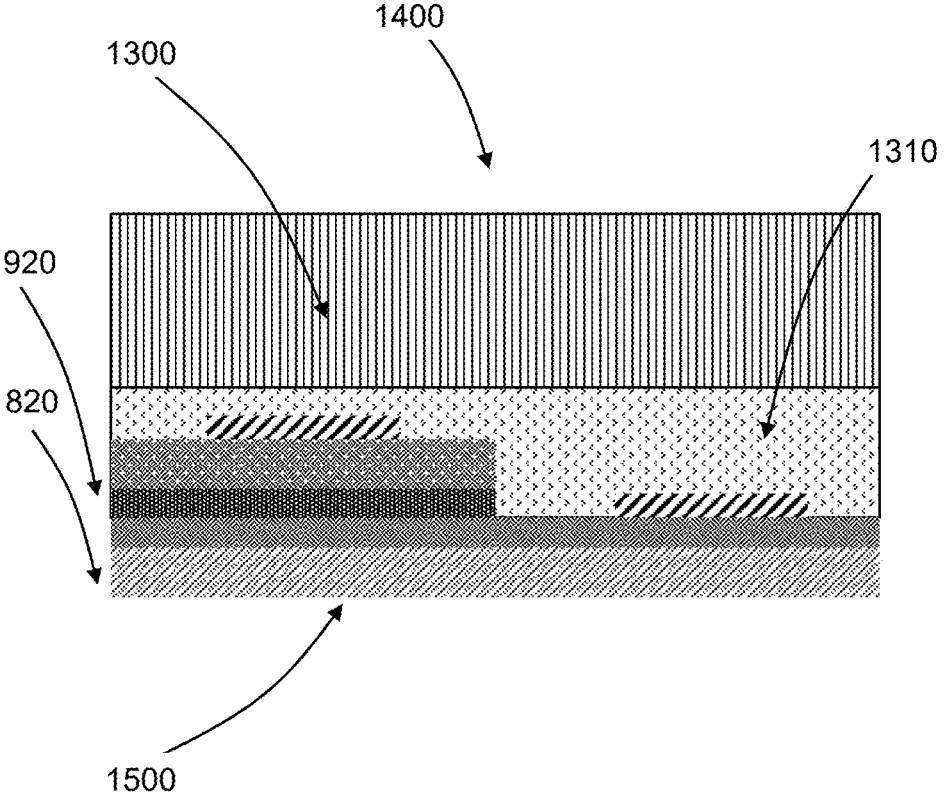
FIG. 15 is an illustration of the exfoliated device after polishing in accordance with an example embodiment.

FIG. 15 is an illustration of exfoliated device 1400 after polishing in accordance with an example embodiment. After the exfoliation of a portion of heterogeneous epitaxial structure 940 with semiconductor device 1210 temporarily coupled to handle wafer 1300, some remnants of plurality of pillars 600 may remain coupled to a remainder of intermediate layer 820. The removal of the remnants of plurality of pillars 600 from the remainder of intermediate layer 820 results in a surface 1500 on the remainder of intermediate layer 820. The removal process may be CMP (Chemical Mechanical Polishing) or etching using a RIE (Reactive Ion Etching). In one embodiment, the polished surface 1500 comprises AlN (aluminum nitride).

Figure 16:
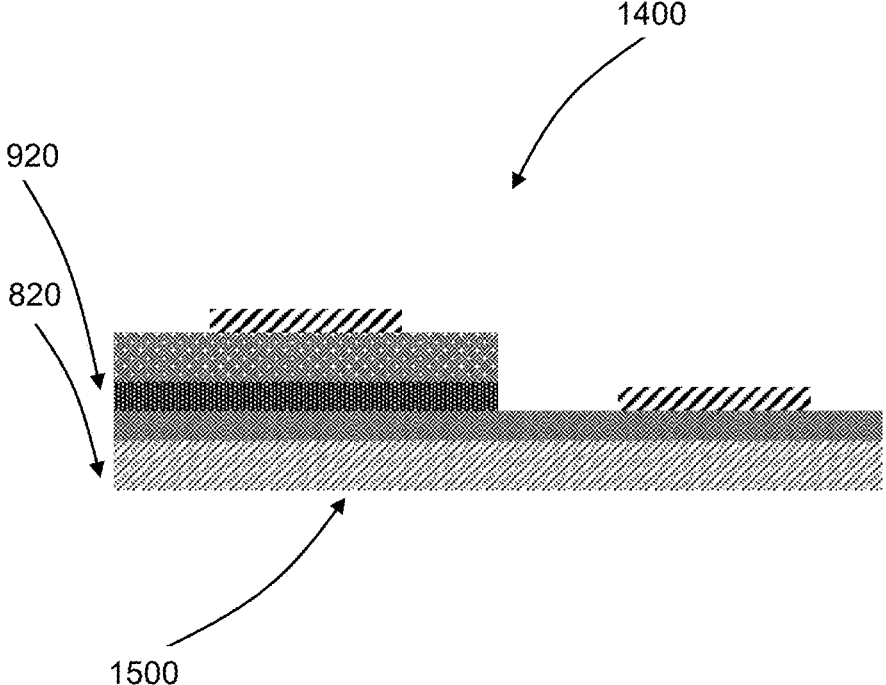
FIG. 16 is an illustration of the exfoliated device after being separated from the handle wafer in accordance with an example embodiment.

FIG. 16 is an illustration of exfoliated device 1400 after being separated from handle wafer 1300 in accordance with an example embodiment. It should be noted that although a single exfoliated device 1400 comprising a LED is shown fabricated on heterogeneous epitaxial structure 940, other exfoliated devices will be formed simultaneously. Typically, heterogeneous epitaxial structure 940 has sufficient area capable to form hundreds or thousands of devices simultaneously, depending on substrate size.

Figure 17:
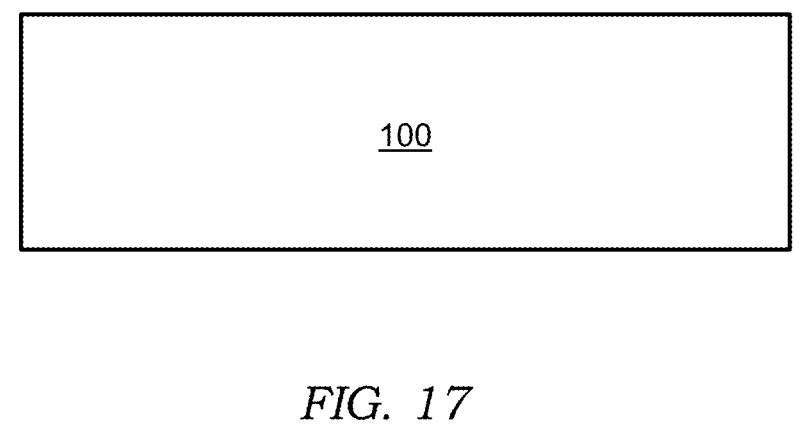

FIG. 17 is an illustration of substrate 100 after reclaim in accordance with an example embodiment. Substrate 100 is reclaimed from substrate 1420 of FIG. 14 after removal of any remnants of plurality of pillars 600 of FIG. 6 and layer 710 of FIG. 7 after the exfoliation process. Since fracture plane 1410 is substantially in the plane of layer 710 of FIG. 7 and causes the fracture of plurality of pillars 600 of FIG. 6, substrate 100 is essentially not consumed by the exfoliation process and may be perpetually used for the fabrication of semiconductor devices in accordance with the current invention. Any remnants of plurality of pillars 600 of FIG. 6 and layer 710 of FIG. 7 may be removed from the surface of substrate 100 leading to a pristine surface with potentially perpetual reuse of substrate 100 for the fabrication of semiconductor devices. The removal of the remnants of plurality of pillars 600 of FIG. 6 and layer 710 of FIG. 7 from surface of substrate 100 may be achieved by using CMP (Chemical Mechanical Polishing) or etching using a RIE (Reactive Ion Etching).

Figure 18:
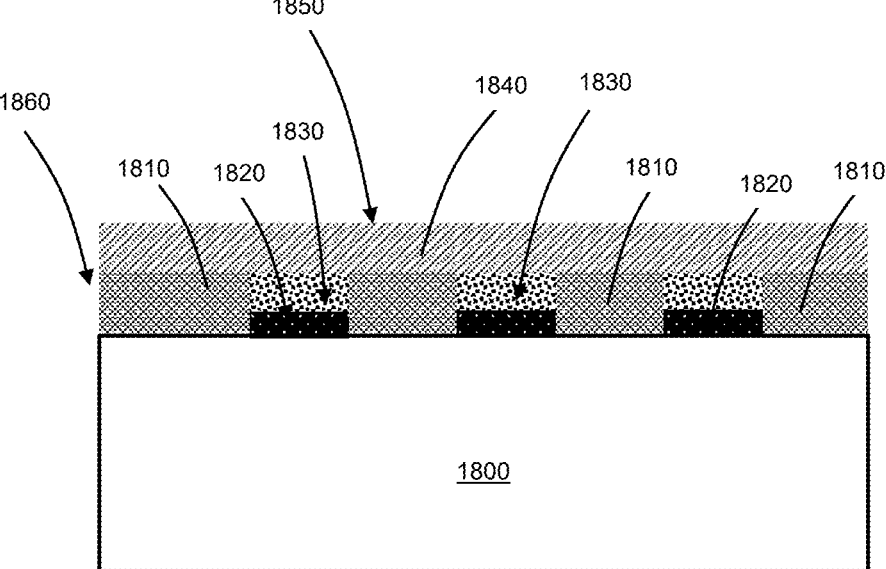
FIG. 18 is an illustration of an intermediate layer of a heterogeneous epitaxial structure in accordance with an example embodiment.

FIG. 18 is an illustration of an intermediate layer 1860 of a heterogeneous epitaxial structure in accordance with an example embodiment. In the example embodiment, a substrate 1800 comprises a first material that is single crystalline in structure. In the example embodiment, substrate 1800 comprises silicon carbide. In another embodiment, substrate 1800 comprises single crystal silicon. A layer of a second material which is also single crystal is grown on the surface of substrate 1800 using a vertical epitaxial growth process and then patterned to form a plurality of pillars 1810 comprising the second material. A layer 1820 of a third material is formed in the regions between plurality of pillars 1810 overlying surface of exposed regions of underlying substrate 1800. In one embodiment, layer 1820 has a height less than a height of plurality of pillars 1810. A second layer of the second material is then grown over surface of plurality of pillars 1810 to form a layer of merged epitaxial lateral overgrowth 1840 of second material using a lateral epitaxial growth process in an epitaxial reactor. In the example embodiment, the layer of merged epitaxial lateral overgrowth 1840 is grown such that it also forms polycrystalline layer 1830 of the second material overlying layer 1820 between plurality of pillars 1810. The growth conditions in the epitaxial reactor are modulated such that lateral growth of the second material occurs from surface of plurality of pillars resulting in merged epitaxial lateral overgrowth 1840 that is continuous due to coalescing of lateral epitaxial fronts from adjacent pillars of plurality of pillars 1810. The layer of merged epitaxial lateral overgrowth 1840 results in a much reduced density of defects transmitted from the underlying surface of plurality of pillars 1810. The surface of merged epitaxial lateral overgrowth 1840 is polished to remove surface defects resulting in a polished surface 1850. This results in the formation of intermediate layer 1860 of a heterogeneous epitaxial structure comprising plurality of pillars 1810 of a second material that is single crystal, polycrystalline layer 1830 of a second material overlying layer 1820 of a third material between plurality of pillars 1810, and a layer of merged epitaxial lateral overgrowth (MELO) 1840 comprising the second material. In the example embodiment, substrate 1800 comprises silicon carbide, intermediate layer 1860 comprises a second material of AlN (aluminum nitride), polycrystalline layer 1830 comprises polycrystalline AlN, and layer 1820 comprises a third material of carbon. After formation of intermediate layer 1860, subsequent layers of a fourth material can be grown to form a heterogeneous epitaxial structure for formation of semiconductor devices with low defect density. Layer 1820 is used to separate or exfoliate the semiconductor devices from substrate 1800 by thermal shock. Substrate 1800 can be reused and is undamaged by the process. Semiconductor devices formed in epitaxial layers are optimized for performance and reliability as the thickness and doping of the epitaxial layers can be controlled very accurately.

Figure 19:
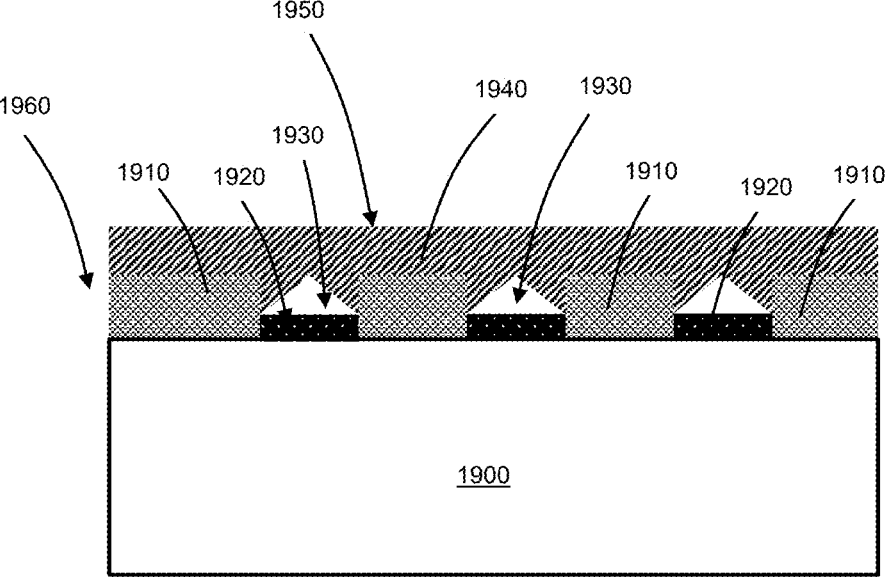
FIG. 19 is an illustration of an intermediate layer of a heterogeneous epitaxial structure in accordance with an example embodiment.

FIG. 19 is an illustration of an intermediate layer 1960 of a heterogeneous epitaxial structure in accordance with an example embodiment. In the example embodiment, a substrate 1900 comprises a first material that is single crystalline in structure. In the example embodiment, substrate 1900 comprises silicon carbide. In another embodiment, substrate 1900 comprises single crystal silicon. A layer of a second material which is also single crystal is grown on the surface of substrate 1900 using a vertical epitaxial growth process and then patterned to form a plurality of pillars 1910 comprising the second material. A layer 1920 of a third material is formed in the regions between plurality of pillars 1910 overlying surface of exposed regions of underlying substrate 1900. In one embodiment, layer 1920 has a height less than a height of plurality of pillars 1910. A second layer of the second material is then grown over the surface of plurality of pillars 1910 to form a layer of merged epitaxial lateral overgrowth 1940 of the second material using a lateral epitaxial growth process in an epitaxial reactor. In the example embodiment, the layer of merged epitaxial lateral overgrowth 1940 is grown such that it also forms a plurality of voids 1930 overlying layer 1920 between plurality of pillars 1910. The growth conditions in the epitaxial reactor are modulated such that lateral growth of the second material occurs from surface of plurality of pillars as well as sidewalls of plurality of pillars 1910 resulting in merged epitaxial lateral overgrowth 1940 that is continuous due to coalescing of lateral epitaxial fronts from adjacent pillars of plurality of pillars 1910 and enclosing plurality of voids 1930. The layer of merged epitaxial lateral overgrowth 1940 results in a much reduced density of defects transmitted from the underlying surface and sidewalls of plurality of pillars 1910. The surface of merged epitaxial lateral overgrowth 1940 is polished to remove surface defects resulting in a polished surface 1950. This results in the formation of intermediate layer 1960 of a heterogeneous epitaxial structure comprising plurality of pillars 1910 of the second material that is single crystal, plurality of voids 1930 overlying layer 1820 of the third material, and a layer of merged epitaxial lateral overgrowth (MELO) 1940 comprising the second material. In the example embodiment, substrate 1900 comprises silicon carbide. Intermediate layer 1960 comprises the second material of AlN (aluminum nitride) and layer 1920 comprises the third material of carbon. After formation of intermediate layer 1960 of a second material, subsequent layers of a fourth material can be grown to form a heterogeneous epitaxial structure for formation of semiconductor devices with low defect density. Layer 1920 is used to separate or exfoliate the semiconductor devices from substrate 1900 by thermal shock. Substrate 1900 can be reused and is undamaged by the process. Semiconductor devices formed in epitaxial layers can be optimized for performance and reliability as the thickness and doping of the epitaxial layers can be controlled very accurately.

Figure 20:
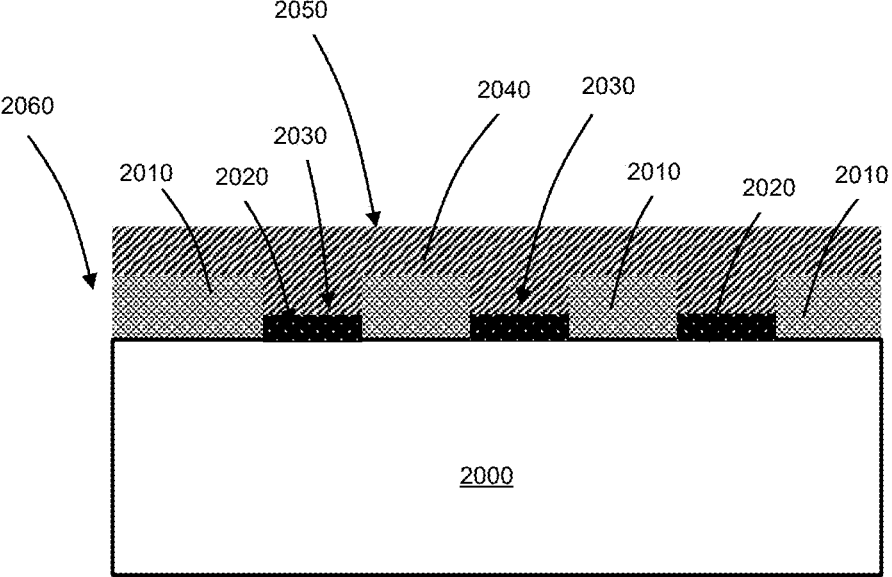
FIG. 20 is an illustration of an intermediate layer of a heterogeneous epitaxial structure in accordance with an example embodiment.

FIG. 20 is an illustration of an intermediate layer 2060 of a heterogeneous epitaxial structure in accordance with an example embodiment. In the example embodiment, a substrate 2000 comprises a first material that is single crystalline in structure. In the example embodiment, substrate 2000 comprises silicon carbide. In another embodiment, substrate 2000 comprises single crystal silicon. A layer of a second material which is also single crystal is grown on the surface of substrate 2000 using a vertical epitaxial growth process and then patterned to form a plurality of pillars 2010 comprising the second material. A layer 2020 of a third material is formed in the regions between plurality of pillars 2010 overlying surface of exposed regions of underlying substrate 2000. In one embodiment, layer 2020 is less than a height of the height of plurality of pillars 2010. A second layer of the second material is then grown over the surface of plurality of pillars 2010 to form a layer of merged epitaxial lateral overgrowth 2040 of the second material using a lateral epitaxial growth process in an epitaxial reactor. In the example embodiment, the layer of merged epitaxial lateral overgrowth 2040 is grown such that it also includes regions 2030 comprising single crystal regions of the second material overlying layer 2020 between plurality of pillars 2010. The growth conditions in the epitaxial reactor are modulated such that lateral growth of the second material occurs from surface of plurality of pillars as well as sidewalls of plurality of pillars 2010 resulting in merged epitaxial lateral overgrowth 2040 that is continuous due to coalescing of lateral epitaxial fronts from adjacent pillars of plurality of pillars 2010. The layer of merged epitaxial lateral overgrowth 2040 results in a much reduced density of defects transmitted from the underlying surface and sidewalls of plurality of pillars 2010. The surface of merged epitaxial lateral overgrowth 2040 is polished to remove surface defects resulting in a polished surface 2050. This results in the formation of intermediate layer 2060 of the heterogeneous epitaxial structure comprising plurality of pillars 2010 of the second material that is single crystal, regions 2030 of single crystal regions of the second material overlying layer 2020 of the third material, and a layer of merged epitaxial lateral overgrowth (MELO) 2040 comprising the second material. In the example embodiment, substrate 2000 comprises silicon carbide, intermediate layer 2060 comprises a second material of AlN, and layer 2020 comprises a third material of carbon. After formation of intermediate layer 2060 of a second material, subsequent layers of a fourth material can be grown to form a heterogeneous epitaxial structure for formation of semiconductor devices with low defect density. Layer 2020 is used to separate or exfoliate the semiconductor devices from substrate 2000 by thermal shock. Substrate 2000 can be reused and is undamaged by the process. Semiconductor devices formed in epitaxial layers are optimized for performance and reliability as the thickness and doping of the epitaxial layers can be controlled very accurately.

While the present invention has been described with reference to certain preferred embodiments or methods, it is to be understood that the present invention is not limited to such specific embodiments or methods. Rather, it is the inventor's contention that the invention be understood and construed in its broadest meaning as reflected by the following claims. Thus, these claims are to be understood as incorporating not only the preferred methods described herein but all those other and further alterations and modifications as would be apparent to those of ordinary skilled in the art.

The descriptions disclosed herein below will call out components, materials, inputs, or outputs from FIGS. 1-20.

In one embodiment, a heterogeneous epitaxial structure 940 having a plurality of devices comprises a substrate 100 of a first material, an intermediate layer 820 comprising a second material formed overlying substrate 100 wherein the surface of intermediate layer 820 comprises merged lateral epitaxial overgrowth (MELO) 800 and wherein intermediate layer 820 includes a third material and at least one device layer 920 of a fourth material formed on the surface of intermediate layer 820 wherein the third material in intermediate layer 820 is configured to be heated to fracture portions of the second material to separate substrate 100 from intermediate layer 820, and wherein substrate 100 is not consumed by exfoliation thereby allowing perpetual reuse of substrate 100.

In one embodiment, heterogeneous epitaxial structure 940 having a plurality of devices wherein intermediate layer 820 comprises a first layer of the second material configured to be formed by vertical epitaxial overgrowth wherein a plurality of voids 810 are configured to be formed in the layer of the second material to create sidewalls in first layer, a layer 710 of the third material configured to be formed in voids 810 in first layer of the second material and a second layer of the second material configured to be formed by merged epitaxial lateral overgrowth layer 800 wherein merged epitaxial lateral overgrowth layer 800 is configured to extend from sidewalls of the first layer and wherein merged epitaxial lateral overgrowth layer 800 from adjacent sidewalls or opposing sidewalls of the first layer merge.

In one embodiment, heterogeneous epitaxial structure 940 having a plurality of devices wherein plurality of voids 810 formed in the first layer are configured to form a plurality of pillars 600 and wherein defect propagation from substrate 100 is reduced by decreasing a top surface area of plurality of pillars 600 in relation to the surface formed by merged lateral epitaxial overgrowth layer 800.

In one embodiment, heterogeneous epitaxial structure 940 having a plurality of devices wherein the top surface of each pillar of plurality of pillars 600 are circular, triangular, square, rectangular, hexagonal, a truncated pyramid, or a point.

In one embodiment, heterogeneous epitaxial 940 structure having a plurality of devices wherein each pillar of plurality of pillars 600 has a top surface area 610 of each pillar in a range of 0.25 microns to 4.0 microns, wherein each adjacent pillar of plurality of pillars 600 has a spacing 630 in a range of 0.25 microns to 4.0 microns, and wherein a height 620 of each pillar of plurality of pillars 600 is in a range of 0.25 microns to 4.0 microns.

In one embodiment, heterogeneous epitaxial structure 940 having a plurality of devices wherein a laser having a power in a range of (0.3-3) J/cm$^2$ is configured to heat the third material and fracture plurality of pillars 600 0to separate substrate 100 from intermediate layer 820.

In one embodiment, heterogeneous epitaxial structure 940 having a plurality of devices wherein the first layer and the second layer of intermediate layer 820 are configured to be formed overlying the entire substrate 100.

In one embodiment, heterogeneous epitaxial structure 940 having a plurality of devices wherein the first layer of the second material has a top surface and wherein the layer of the third material is below the top surface of the first layer of the second material.

In one embodiment, heterogeneous epitaxial structure 940 having a plurality of devices wherein a void or gap is formed between the layer of the third material in plurality of voids 810 in the first layer of intermediate layer 820 and surface of the intermediate layer 820 comprising merged lateral epitaxial overgrowth (MELO) layer 800.

In one embodiment, heterogeneous epitaxial structure 940 having a plurality of devices wherein the third material comprises carbon or tantalum carbide and wherein the carbon or tantalum carbide is configured to be heated by laser to exfoliate intermediate layer 820 from substrate 100.

In one embodiment, heterogeneous epitaxial structure 940 having a plurality of devices wherein the second material is configured to be grown on substrate 100 in an epitaxial reactor.

In one embodiment, heterogeneous epitaxial structure 940 having a plurality of devices wherein intermediate layer 820 is less than 10 microns in depth.

In one embodiment, heterogeneous epitaxial structure 940 having a plurality of devices wherein the second material has a lattice constant difference less than 5% to substrate 100 and wherein the fourth material has a lattice constant difference less than 5% to the second material of intermediate layer 820.

In one embodiment, heterogeneous epitaxial structure 940 having a plurality of devices wherein substrate 100 comprises Silicon Carbide or Silicon, wherein the second material comprises Aluminum Nitride, wherein the fourth material comprises Gallium Nitride, wherein substrate 100, the second material, and the fourth material are single crystal, and wherein the plurality of devices comprises diodes, light emitting diodes, transistors, or power transistors.

In one embodiment, heterogeneous epitaxial structure 940 having a plurality of devices comprises substrate 100 of a first material, an intermediate layer 820 overlying substrate 100 comprising a first layer of a second material configured to be formed by vertical epitaxial overgrowth, plurality of pillars 600 formed in the first layer wherein each pillar of plurality of pillars 600 has a top surface, a layer 710 of a third material formed between plurality of pillars 600 and a second layer of the second material configured to be formed by merged epitaxial lateral overgrowth layer 800 wherein merged epitaxial lateral overgrowth layer 800 extends from the sidewalls of plurality of pillars 600, wherein merged epitaxial lateral overgrowth layer 800 merges between adjacent or opposing pillars of plurality of pillars 600, and wherein a void or gap exists between a portion of layer 710 of the third material and a surface of intermediate layer 820 and at least one device layer 920 of a fourth material formed on the surface of intermediate layer 820 wherein the plurality of devices are formed on or in the at least one device layer 920.

In one embodiment, heterogeneous epitaxial structure 940 having a plurality of devices wherein the top surface of each pillar of plurality of pillars 600 are circular, triangular, square, rectangular, hexagonal, a truncated pyramid, or a point and wherein dislocation propagation is reduced by decreasing top surface area 610 of each pillar of plurality of pillars 600.

In one embodiment, heterogeneous epitaxial structure 940 having a plurality of devices wherein the first material, the second material, and the fourth material are formed single crystal, wherein substrate 100 comprises silicon or silicon carbide, wherein the second material comprises Aluminum Nitride, and wherein the fourth material comprises GaN.

In one embodiment, heterogeneous epitaxial structure 940 having a plurality of devices wherein the second material has a lattice constant difference less than 5% to substrate 100 and wherein the fourth material has a lattice constant difference less than 5% to the second material of intermediate layer 820.

In one embodiment, heterogeneous epitaxial structure 940 having a plurality of devices wherein top surface area 610 of each pillar of plurality of pillars 600 is in a range of 0.25 microns to 4.0 microns, wherein each adjacent pillar of plurality of pillars 600 has spacing 630 in a range of 0.25 microns to 4.0 microns, and wherein height 620 of each pillar of plurality of pillars 600 is in a range of 0.25 microns to 4.0 microns.

In one embodiment, heterogeneous epitaxial structure 940 having a plurality of devices wherein the third material comprises carbon or tantalum carbide, wherein the third material is configured to be heated by laser to fracture pillars of plurality of pillars 600 to support exfoliation of intermediate layer 820 and the at least one device layer 920 from substrate 100, and wherein substrate 100 is not consumed by the exfoliation thereby allowing reuse of the substrate.

In one embodiment, heterogeneous epitaxial structure 940 having a plurality of devices comprises substrate 100 comprising silicon carbide (SiC) or silicon, intermediate layer 820 comprising plurality of pillars 600 formed in a first layer of intermediate layer 820 wherein the first layer comprises Aluminum Nitride (AlN) and wherein the first layer is configured to be grown by vertical epitaxy, a layer of carbon or tantalum carbide in areas between plurality of pillars 600 and a second layer of AlN configured to be grown by merged epitaxial lateral overgrowth layer 800 wherein the second layer extends from sidewalls of plurality of pillars 600, wherein merged epitaxial lateral overgrowth (MELO) layer 800 is configured to occur between adjacent or opposing pillars of plurality of pillars 600 and at least one device layer 920 comprising gallium nitride (GaN) configured to be formed by vertical epitaxy overlying intermediate layer 820 wherein substrate 100, the first and second layers of intermediate layer 820, and the at least one device layer 920 are configured to be formed single crystal, wherein the third material is configured to be heated by laser to fracture portions of the AlN in intermediate layer 820 to fracture intermediate layer 820 to exfoliate intermediate layer 820 from substrate 100 such that substrate 100 is not consumed by exfoliation and is configured for reuse, and wherein the plurality of devices comprises diodes or transistors.

In one embodiment, heterogeneous epitaxial structure 940 having a plurality of devices wherein a top surface of each pillar of plurality of pillars 600 are circular, triangular, square, rectangular, hexagonal, a truncated pyramid, or a point and wherein dislocation propagation to the at least one device layer 920 is reduced by decreasing top surface area 610 of each pillar of plurality of pillars 600 thereby increasing a surface comprising merged epitaxial lateral overgrowth layer 800 of intermediate layer 820.

In one embodiment, heterogeneous epitaxial structure 940 having a plurality of devices wherein each pillar of plurality of pillars 600 has top surface area 610 of each pillar in a range of 0.25 microns to 4.0 microns, wherein each adjacent pillar of plurality of pillars 600 has spacing 630 in a range of 0.25 microns to 4.0 microns, wherein height 620 of each pillar of plurality of pillars 600 is in a range of 0.25 microns to 4.0 microns, and wherein heating the third material is configured to fracture pillars of plurality of pillars 600 adjacent to the third material without damage to substrate 100.

In one embodiment, heterogeneous epitaxial structure 940 having a plurality of devices wherein plurality of pillars 600 are formed substantially over the entire surface of substrate 100.

What is claimed:

1. A heterogeneous epitaxial structure having a plurality of devices comprising:
  a substrate of a first material;
  an intermediate layer comprising a second material formed overlying the substrate wherein the surface of the intermediate layer comprises merged lateral epitaxial overgrowth (MELO) and wherein the intermediate layer includes a third material; and
  at least one device layer of a fourth material formed on the surface of the intermediate layer wherein the third material in the intermediate layer is configured to be heated to fracture portions of the second material to separate the substrate from the intermediate layer, and wherein the substrate is not consumed by exfoliation thereby allowing perpetual reuse of the substrate.

2. The heterogeneous epitaxial structure having a plurality of devices of claim 1 wherein the intermediate layer comprises:

a first layer of the second material configured to be formed by vertical epitaxial overgrowth wherein a plurality of voids are configured to be formed in the layer of the second material to create sidewalls in the first layer;

a layer of the third material configured to be formed in the voids in the first layer of the second material; and a second layer of the second material configured to be formed by epitaxial lateral overgrowth wherein the epitaxial lateral overgrowth is configured to extend from sidewalls of the first layer and wherein the epitaxial lateral overgrowth from adjacent sidewalls or opposing sidewalls of the first layer merge.

3. The heterogeneous epitaxial structure having a plurality of devices of claim 2 wherein the plurality of voids formed in the first layer are configured to form a plurality of pillars and wherein defect propagation from the substrate is reduced by decreasing a top surface area of the plurality of pillars in relation to the surface formed by merged lateral epitaxial overgrowth.

4. The heterogeneous epitaxial structure having a plurality of devices of claim 3 wherein the top surface of each pillar of the plurality of pillars are circular, triangular, square, rectangular, hexagonal, a truncated pyramid, or a point.

5. The heterogeneous epitaxial structure having a plurality of devices of claim 3 wherein each pillar of the plurality of pillars has a top surface area of each pillar in a range of 0.25 microns to 4.0 microns, wherein each adjacent pillar of the plurality of pillars has a spacing in a range of 0.25 microns to 4.0 microns, and wherein a height of each pillar of the plurality of pillars is in a range of 0.25 microns to 4.0 microns.

6. The heterogeneous epitaxial structure having a plurality of devices of claim 3 wherein a laser having a power in a range of (0.3-3) $J/cm^2$ is configured to heat the third material and fracture the plurality of pillars to separate the substrate from the intermediate layer.

7. The heterogeneous epitaxial structure having a plurality of devices of claim 2 wherein the first layer and the second layer of the intermediate layer are configured to be formed overlying the entire substrate.

8. The heterogeneous epitaxial structure having a plurality of devices of claim 2 wherein the first layer of the second material has a top surface and wherein the layer of the third material is below the top surface of the first layer of the second material.

9. The heterogeneous epitaxial structure having a plurality of devices of claim 2 wherein a void or gap is formed between the layer of the third material in the plurality of voids in the first layer of the intermediate layer and the surface of the intermediate layer comprising merged lateral epitaxial overgrowth (MELO).

10. The heterogeneous epitaxial structure having a plurality of devices of claim 2 wherein the third material comprises carbon or tantalum carbide and wherein the carbon or tantalum carbide is configured to be heated by laser to exfoliate the intermediate layer from the substrate.

11. The heterogeneous epitaxial structure having a plurality of devices of claim 2 wherein the second material is configured to be grown on the substrate in an epitaxial reactor.

12. The heterogeneous epitaxial structure having a plurality of devices of claim 2 wherein the intermediate layer is less than 10 microns in depth.

13. The heterogeneous epitaxial structure having a plurality of devices of claim 2 wherein the second material has a lattice constant difference less than 5% to the substrate and wherein the fourth material has a lattice constant difference less than 5% to the second material of the intermediate layer.

14. The heterogeneous epitaxial structure having a plurality of devices of claim 2 wherein the substrate comprises Silicon Carbide or Silicon, wherein the second material comprises Aluminum Nitride, wherein the fourth material comprises Gallium Nitride, wherein the substrate, the second material, and the fourth material are single crystal, and wherein the plurality of devices comprises diodes, light emitting diodes, transistors, or power transistors.

15. A heterogeneous epitaxial structure having a plurality of devices comprising:

a substrate of a first material;

an intermediate layer overlying the substrate comprising:

a first layer of a second material configured to be formed by vertical epitaxial overgrowth;

a plurality of pillars formed in the first layer wherein each pillar of the plurality of pillars has a top surface;

a layer of a third material formed between the plurality of pillars; and a second layer of the second material configured to be formed by epitaxial lateral overgrowth wherein the epitaxial lateral overgrowth extends from the sidewalls of the plurality of pillars, wherein the epitaxial lateral overgrowth merges between adjacent or opposing pillars of the plurality of pillars, and wherein a void or gap exists between a portion of the layer of the third material and a surface of the intermediate layer;

and at least one device layer of a fourth material formed on the surface of the intermediate layer wherein the plurality of devices are formed on or in the at least one device layer.

16. The heterogeneous epitaxial structure having a plurality of devices of claim 15 wherein the top surface of each pillar of the plurality of pillars are circular, triangular, square, rectangular, hexagonal, a truncated pyramid, or a point and wherein dislocation propagation is reduced by decreasing the top surface area of each pillar of the plurality of pillars.

17. The heterogeneous epitaxial structure having a plurality of devices of claim 15 wherein the first material, the second material, and the fourth material are formed single crystal, wherein the substrate comprises silicon or silicon carbide, wherein the second material comprises Aluminum Nitride, and wherein the fourth material comprises GaN.

18. The heterogeneous epitaxial structure having a plurality of devices of claim 15 wherein the second material has a lattice constant difference less than 5% to the substrate and wherein the fourth material has a lattice constant difference less than 5% to the second material of the intermediate layer.

19. The heterogeneous epitaxial structure having a plurality of devices of claim 15 wherein the top surface area of each pillar of the plurality of pillars is in a range of 0.25 microns to 4.0 microns, wherein each adjacent pillar of the plurality of pillars has a spacing in a range of 0.25 microns to 4.0 microns, and wherein a height of each pillar of the plurality of pillars is in a range of 0.25 microns to 4.0 microns.

20. The heterogeneous epitaxial structure having a plurality of devices of claim 15 wherein the third material comprises carbon or tantalum carbide, wherein the third material is configured to be heated by laser to fracture pillars of the plurality of pillars to support exfoliation of the intermediate layer and the at least one device layer from the substrate, and wherein the substrate is not consumed by the exfoliation thereby allowing reuse of the substrate.

21. A heterogeneous epitaxial structure having a plurality of devices comprising:

a substrate comprising silicon carbide (SiC) or silicon;

an intermediate layer comprising:

a plurality of pillars formed in a first layer of the intermediate layer wherein the first layer comprises Aluminum Nitride (AlN) and wherein the first layer is configured to be grown by vertical epitaxy;

a layer of carbon or tantalum carbide in areas between the plurality of pillars; and a second layer of AlN configured to be grown by epitaxial lateral overgrowth wherein the second layer extends from sidewalls of the plurality of pillars, wherein merged epitaxial lateral overgrowth (MELO) is configured to occur between adjacent or opposing pillars of the plurality of pillars;

at least one device layer comprising gallium nitride (GaN) configured to be formed by vertical epitaxy overlying the intermediate layer wherein the substrate, the first and second layers of the intermediate layer, and the at least one device layer are configured to be formed single crystal, wherein the third material is configured to be heated by laser to fracture portions of the AlN in the intermediate layer to fracture the intermediate layer to exfoliate the intermediate layer from the substrate such that the substrate is not consumed by exfoliation and is configured for reuse, and wherein the plurality of devices comprises diodes or transistors.

22. The heterogeneous epitaxial structure having a plurality of devices of claim 21 wherein a top surface of each pillar of the plurality of pillars are circular, triangular, square, rectangular, hexagonal, a truncated pyramid, or a point and wherein dislocation propagation to the at least one device layer is reduced by decreasing the top surface area of each pillar of the plurality of pillars thereby increasing a surface comprising merged epitaxial lateral overgrowth of the intermediate layer.

23. The heterogeneous epitaxial structure having a plurality of devices of claim 21 wherein each pillar of the plurality of pillars has a top surface area of each pillar in a range of 0.25 microns to 4.0 microns, wherein each adjacent pillar of the plurality of pillars has a spacing in a range of 0.25 microns to 4.0 microns, wherein a height of each pillar of the plurality of pillars is in a range of 0.25 microns to 4.0 microns, and wherein heating the third material is configured to fracture pillars of the plurality of pillars adjacent to the third material without damage to the substrate.

24. The heterogeneous epitaxial structure having a plurality of devices of claim 21 wherein the plurality of pillars are formed substantially over the entire surface of the substrate.

* * * * *